(12) United States Patent
Haneda et al.

(10) Patent No.: US 12,198,892 B2
(45) Date of Patent: Jan. 14, 2025

(54) SAMPLE HOLDER AND CHARGED PARTICLE BEAM APPARATUS

(71) Applicant: Hitachi High-Tech Corporation, Tokyo (JP)

(72) Inventors: Shigeru Haneda, Tokyo (JP); Junzo Azuma, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 649 days.

(21) Appl. No.: 17/595,678

(22) PCT Filed: May 27, 2019

(86) PCT No.: PCT/JP2019/020877
§ 371 (c)(1),
(2) Date: Apr. 19, 2022

(87) PCT Pub. No.: WO2020/240655
PCT Pub. Date: Dec. 3, 2020

(65) Prior Publication Data
US 2022/0277923 A1    Sep. 1, 2022

(51) Int. Cl.
*H01J 37/20* (2006.01)
*H01J 37/244* (2006.01)
*H01J 37/28* (2006.01)

(52) U.S. Cl.
CPC ............ *H01J 37/20* (2013.01); *H01J 37/244* (2013.01); *H01J 37/28* (2013.01)

(58) Field of Classification Search
CPC .......... H01J 37/20; H01J 37/244; H01J 37/28; H01J 2237/2007; H01J 2237/2008; H01J 2237/2062; Y02E 60/10
See application file for complete search history.

(56) References Cited

U.S. PATENT DOCUMENTS 11,621,141 B2 * 4/2023 Iwaya ................... H01J 37/304
                                                          250/307
2015/0207177 A1 * 7/2015 Ose ................... H01M 10/0562
                                                          429/162
(Continued)

FOREIGN PATENT DOCUMENTS

JP          9-35724 A     2/1997
JP     2016-207425 A    12/2016
(Continued)

OTHER PUBLICATIONS

International Search Report (PCT/ISA/210) issued in PCT Application No. PCT/JP2019/020877 dated Aug. 6, 2019 with English translation (two (2) pages).
(Continued)

*Primary Examiner* — David A Vanore
(74) *Attorney, Agent, or Firm* — Crowell & Moring LLP

(57) ABSTRACT

A sample holder HL capable of efficiently applying a pressure to an observation surface of a sample SAM is provided. The sample holder HL includes a fixed electrode 4b, a movable electrode 5, and a pressure applying member 6 attached to the movable electrode 5 and having a function to move the movable electrode 5 in a horizontal direction. When the sample SAM is held between a side surface of the fixed electrode 4b and a side surface of the movable electrode 5, an upper surface of the sample SAM is located within a range of a width of the pressure applying member 6 at a position where the pressure applying member 6 is in contact with the movable electrode 5 in the Z direction.

15 Claims, 8 Drawing Sheets

(56) References Cited

U.S. PATENT DOCUMENTS

| | | | |
|---|---|---|---|
| 2022/0042945 A1* | 2/2022 | Nakazawa | G01N 27/44721 |
| 2023/0204539 A1* | 6/2023 | Noda | G01N 27/44791 |
| | | | 204/602 |
| 2024/0079201 A1* | 3/2024 | Hatano | H01J 37/20 |

FOREIGN PATENT DOCUMENTS

| | | |
|---|---|---|
| JP | 2017-139175 A | 8/2017 |
| JP | 2017-204377 A | 11/2017 |
| WO | WO 2014/016907 A1 | 1/2014 |

OTHER PUBLICATIONS

Japanese-language Written Opinion (PCT/ISA/237) issued in PCT Application No. PCT/JP2019/020877 dated Aug. 6, 2019 (three (3) pages).

* cited by examiner

A-A CROSS-SECTION

A-A CROSS-SECTION

A-A CROSS-SECTION

A-A CROSS-SECTION

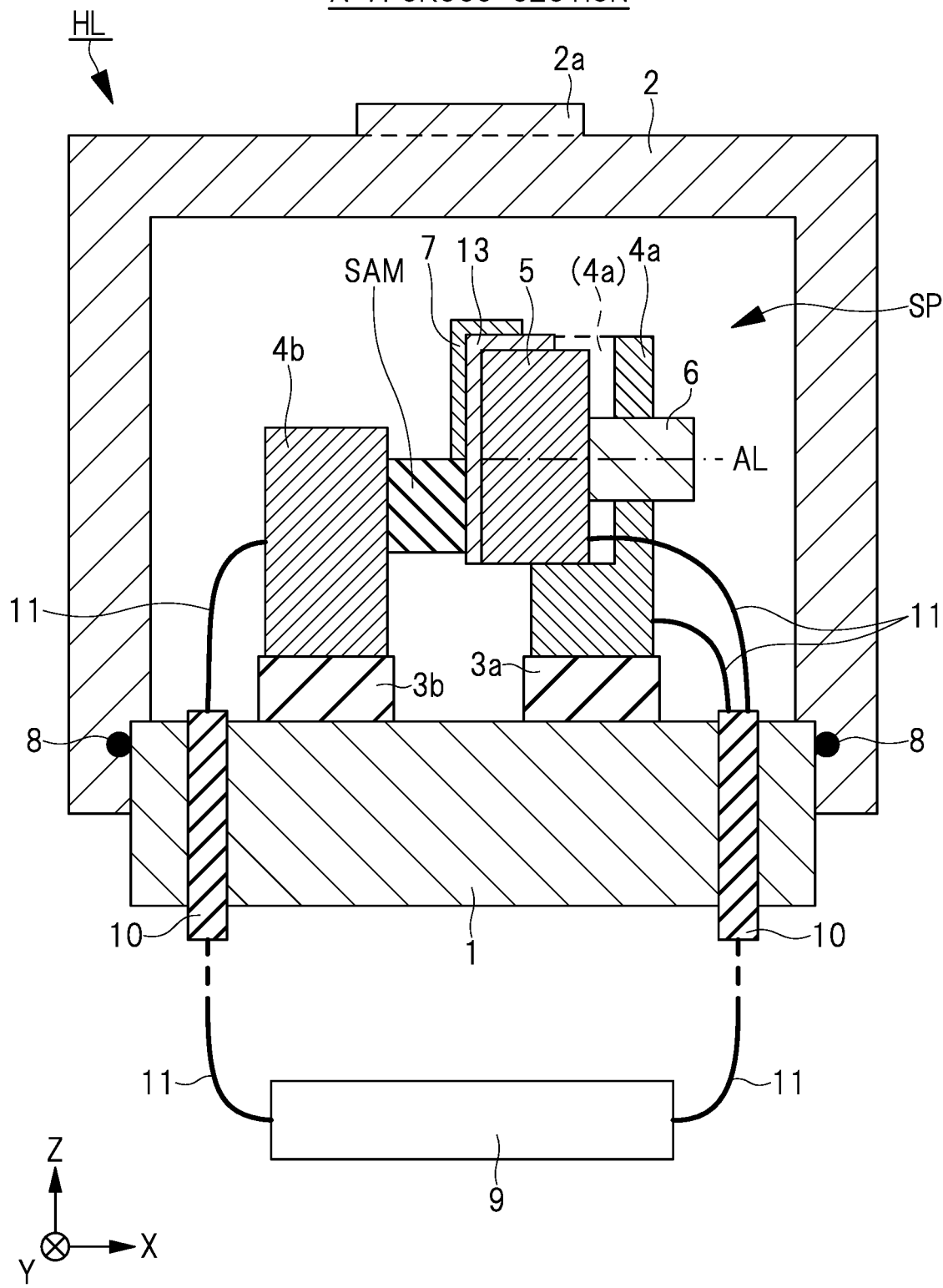

SAMPLE HOLDER AND CHARGED PARTICLE BEAM APPARATUS

TECHNICAL FIELD

The present invention relates to a sample holder and a charged particle beam apparatus capable of mounting the sample holder, and can be suitably used for a sample holder in which an electrode to electrify a sample is provided.

BACKGROUND ART

In recent years, all-solid-state batteries such as lithium ion secondary batteries have been expected as, for example, mobile batteries because of their characteristics of being able to obtain high capacity and high energy density. The lithium ion secondary battery is mainly composed of a positive electrode plate, a solid electrolyte, and a negative electrode plate. The positive electrode plate and the negative electrode plate contain an active material, but since the active material repeatedly expands and contracts during charging and discharging of the lithium ion secondary battery, there is the problem that the electrode plate is deformed and the cycle life is shortened.

Observing such changes in the state of the electrode plate during charging and discharging or the behavior of lithium ions with respect to the electrode plate is important for the development in technology to improve the capacity and life of the lithium ion secondary battery. For example, Patent Document 1 discloses a technique of supplying a current to an all-solid-state battery as an observation sample and simultaneously measuring a compressive force acting on the electrified all-solid-state battery.

Also, Patent Document 2 discloses knowledges in holding a laminated all-solid-state battery. According to Patent Document 2, if the pressure for holding the laminated body is not uniform, the load may be concentrated in the region where the pressure is high and electrode cracking may occur, and the conduction between the layers becomes insufficient in the region where the pressure is low and the battery performance as a whole may be deteriorated.

On the other hand, as disclosed in Patent Document 3 and Patent Document 4, the positive electrode plate, the solid electrolyte, and the negative electrode plate of the all-solid-state battery are formed by being sequentially laminated by a powder molding method in many cases. Therefore, the all-solid-state battery also has an aspect of being vulnerable to pressure.

RELATED ART DOCUMENTS

Patent Documents

Patent Document 1: Japanese Unexamined Patent Application Publication No. 2016-207425
Patent Document 2: Japanese Unexamined Patent Application Publication No. 2017-204377
Patent Document 3: International Patent Application Publication No. 2014/016907
Patent Document 4: Japanese Unexamined Patent Application Publication No. H09-35724

SUMMARY OF THE INVENTION

Problems to be Solved by the Invention

When observing the surface state of a sample by using a charged particle beam apparatus such as a scanning electron microscope (SEM), the charged particle beam apparatus is provided with a sample holder as a mechanism for holding the sample. Also, as described above, it is required to use an all-solid-state battery as an observation sample and observe the behavior of the all-solid-state battery in a conductive state.

Therefore, a technique for observing structural changes in an all-solid-state battery in a conductive state by using a charged particle beam apparatus is necessary. In particular, not only the technique of observing the structure of the sample before and after the pressure change occurs, but also the technique of observing the process of how the structure of the sample in the conductive state to which the pressure is applied changes is desired.

From such a viewpoint, for example, when a pressure is to be applied to a sample by using the technique disclosed in Patent Document 1, it is difficult to efficiently apply the pressure to a desired observation surface, so that it is difficult to obtain an accurate observation image from the observation surface.

One of the objects of this application is to provide a sample holder capable of efficiently applying a pressure to the observation surface of a sample. Another object of this application is to obtain a more accurate observation image by a charged particle beam apparatus provided with such a sample holder.

The other problems and novel features will be apparent from the description of this specification and accompanying drawings.

Means for Solving the Problem

An outline of the typical embodiment disclosed in this application will be briefly described as follows.

A sample holder according to an embodiment includes a first electrode having a first side surface, a second electrode having a second side surface facing the first side surface, and a pressure applying member attached to the first electrode and having a function to move the first electrode in a horizontal direction. Here, when a sample is held between the first side surface and the second side surface, an upper surface of the sample can be located within a range of a first width of the pressure applying member at a position where the pressure applying member is in contact with the first electrode, in a height direction orthogonal to the horizontal direction.

Also, a sample holder according to an embodiment includes a first electrode having a first side surface, a second electrode having a second side surface facing the first side surface, and a pressure applying member attached to the first electrode and having a function to move the first electrode in a horizontal direction. Here, a jig is provided on the first side surface or the second side surface, and a lower surface of the jig is located within a range of a first width of the pressure applying member at a position where the pressure applying member is in contact with the first electrode, in a height direction orthogonal to the horizontal direction.

Also, a charged particle beam apparatus according to an embodiment can mount a sample holder on which a sample is held, and can confirm how the structure of the sample, which is turned into a conductive state by the sample holder and to which a pressure is applied by the sample holder, changes as a plurality of observation images at the time of observation of the sample.

Effect of the Invention

According to an embodiment, it is possible to provide a sample holder capable of efficiently applying a pressure to an observation surface of a sample. Also, it is possible to acquire a more accurate observation image by a charged particle beam apparatus provided with such a sample holder.

BRIEF DESCRIPTIONS OF THE DRAWINGS

FIG. 8 is a cross-sectional view showing a sample holder according to the third modification.

DETAILED DESCRIPTION OF PREFERRED EMBODIMENTS

Figure 1:
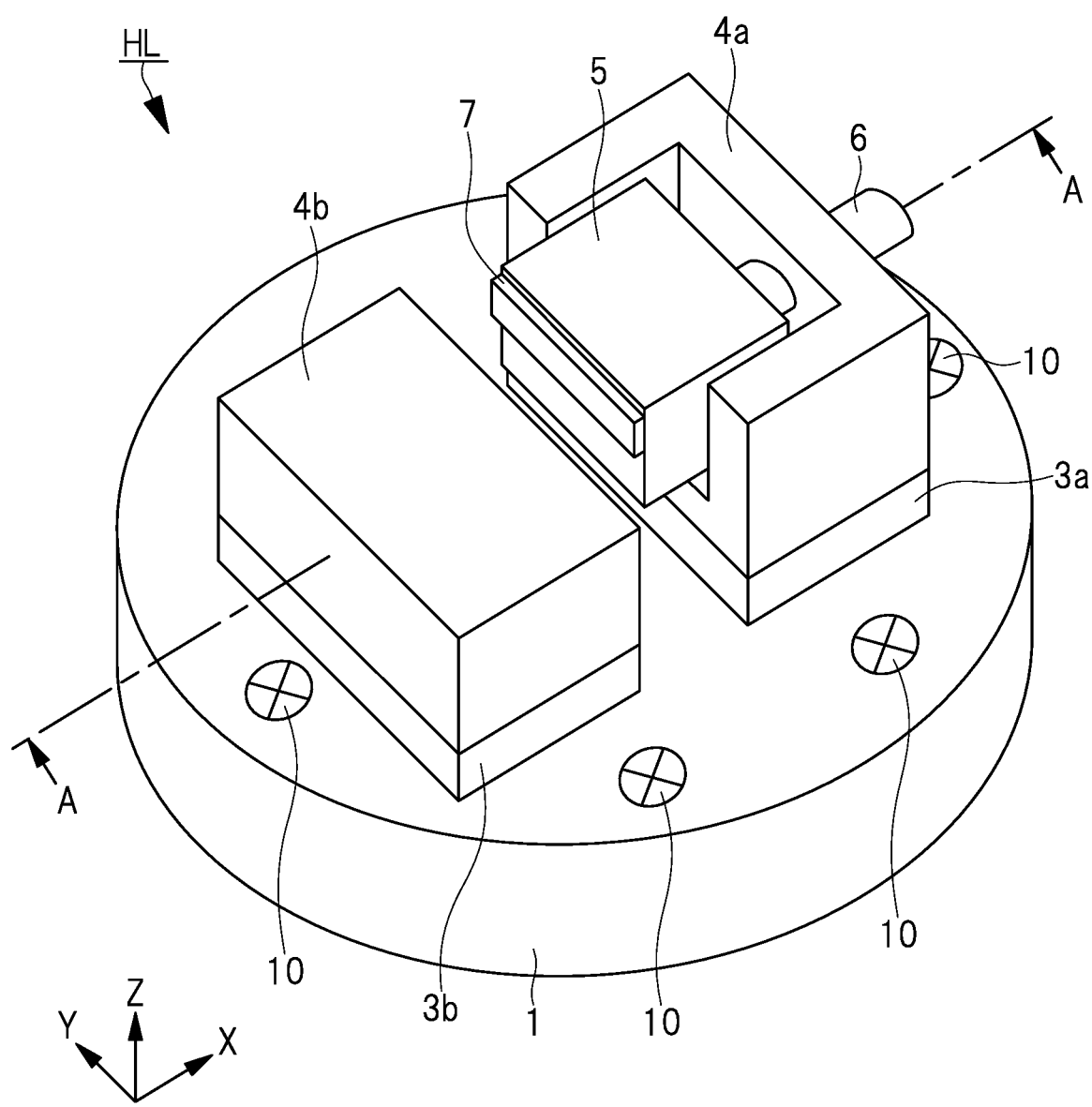
FIG. 1 is a perspective view showing a sample holder according to the first embodiment.

Hereinafter, embodiments will be described in detail with reference to drawings. In all the drawings for describing the embodiments, members having the same function are denoted by the same reference characters and the repetitive description thereof will be omitted. Also, in the following embodiments, the description of the same or similar part is not repeated in principle unless particularly required.

Also, in the drawings used in the embodiments, hatching is omitted in some cases even in a cross-sectional view in order to make the drawing easy to see.

In addition, the X direction, the Y direction, and the Z direction shown in the drawings are orthogonal to each other. In the following description, the X direction and the Y direction are defined as horizontal directions and the Z direction is defined as a vertical direction in some cases.

First Embodiment

<Sample Holder HL in First Embodiment>

Figure 2:
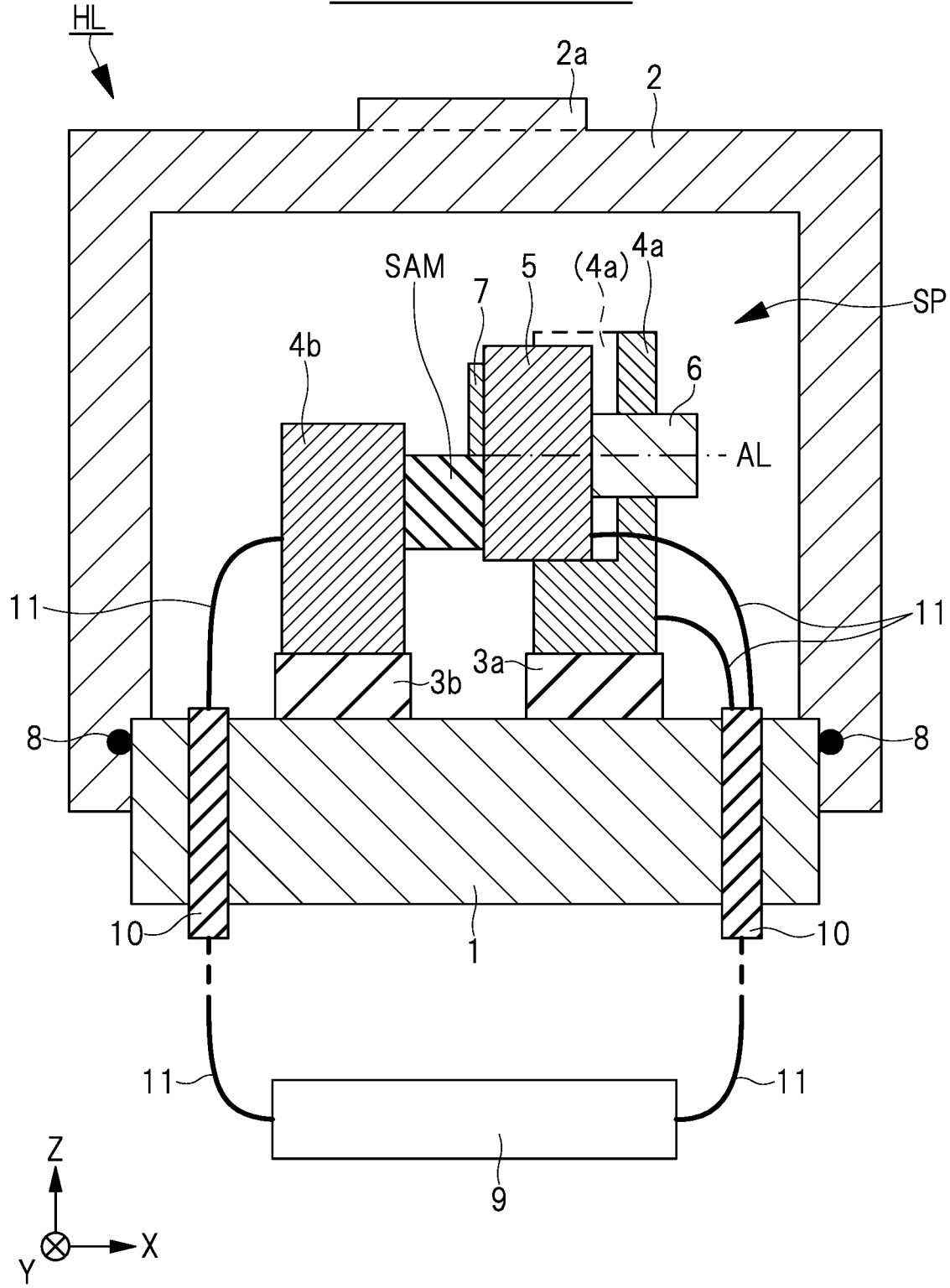
FIG. 2 is a cross-sectional view showing the sample holder according to the first embodiment.

A sample holder HL for a charged particle beam apparatus according to the first embodiment will be described below with reference to FIG. 1 and FIG. 2. FIG. 1 is a perspective view showing a major part of the sample holder HL and FIG. 2 is a cross-sectional view along a line A-A shown in FIG. 1. Further, FIG. 1 shows the sample holder HL in the state where a partition wall 2 is detached.

In the first embodiment, a sample SAM is an electronic material such as a secondary battery, and specifically is an all-solid-state battery such as a lithium ion secondary battery. Note that the sample SAM is not shown in FIG. 1.

The sample holder HL includes a base 1 and a partition wall 2 as external constituent members, and the partition wall 2 is formed to have a concave lower surface. The base 1 and the partition wall 2 are connected by an O-ring 8 functioning as a sealing material. Therefore, a space SP surrounded by the base 1 and the partition wall 2 is sealed and isolated from the outside of the sample holder HL. When the sample SAM is stored using the sample holder HL, problems such as oxidation of the sample SAM can be prevented because the space SP can be filled with an inert gas such as nitrogen gas or argon gas.

Also, the partition wall 2 is detachable from the base 1, and the partition wall 2 is detached when the sample SAM is observed using a charged particle beam apparatus CRD described later or when the sample SAM is replaced. A protrusion 2a for taking out is provided on an upper part of the partition wall 2. The protrusion 2a has, for example, a hook shape and is integrated with the partition wall 2. The partition wall 2 can be detached by inserting a pin having a shape matching the hook shape and rotating the partition wall 2 to loosen a screw provided between the partition wall 2 and the base 1.

On the base 1, a fixed electrode 4a is provided via an insulating member 3a, and a fixed electrode 4b is provided via an insulating member 3b. A rod-shaped pressure applying member 6 is provided in the fixed electrode 4a, and a tip of the pressure applying member 6 is attached to a movable electrode 5. A side surface of the movable electrode 5 faces a side surface of the fixed electrode 4b.

The pressure applying member 6 is, for example, a headless screw (set screw) and has a function to move the movable electrode 5 in the horizontal direction (X direction). Namely, when the pressure applying member 6 is a headless screw, the movable electrode 5 moves in the X direction by rotating the pressure applying member 6.

The pressure applying member 6 is not limited to the headless screw mentioned above as long as the movable electrode 5 can be moved in the X direction. For example, the pressure applying member 6 may be a screw having another shape such as a pan head screw or a flat head screw, or may be a hexagon socket head cap screw or a hexagon bolt. Further, the pressure applying member 6 may be a member capable of moving the movable electrode 5 by adjusting hydraulic pressure, water pressure, pneumatic pressure, or voltage applied to a piezoelectric element.

Since the movable electrode 5 is movable in the X direction as described above, the sample SAM can be held so as to be sandwiched between the fixed electrode 4b and the movable electrode 5, and a desired pressure can be applied to the sample SAM. Further, since the position of an axis line AL of the rod-shaped pressure applying member 6 is substantially the same as the position of an upper surface of the sample SAM, a pressure can be efficiently applied to the upper surface of the sample SAM to be observed.

Also, it is preferable that at least a part of the movable electrode 5 is provided on the fixed electrode 4a such that a lower surface of the movable electrode 5 is in contact with an upper surface of the fixed electrode 4a. This stabilizes the position of the movable electrode 5 in the height direction (Z direction).

A jig (alignment member) 7 is provided on the side surface of the movable electrode 5 facing the fixed electrode 4b. The jig 7 is mainly provided for adjusting the height position of the sample SAM. Namely, by setting the position where the upper surface of the sample SAM is in contact with a lower surface of the jig 7 as the measurement position, the height position of the sample SAM can be easily adjusted.

The main feature of the first embodiment is the structures and the positional relationship of the fixed electrode 4a, the fixed electrode 4b, the movable electrode 5, the pressure applying member 6, and the jig 7 provided in the sample holder HL, and such a feature will be described in detail after the description of the charged particle beam apparatus CRD.

Further, the movable electrode 5, the fixed electrode 4a, and the fixed electrode 4b function as electrodes for charging and discharging the sample SAM.

The base 1 has a plurality of holes provided so as to penetrate the base 1, insulating films are formed on inner walls of the plurality of holes, and a plurality of wiring members 10 are formed inside the plurality of holes via the insulating films. Therefore, the base 1 and the plurality of wiring members 10 are insulated from each other.

A power supply 9 is provided outside the sample holder HL and is electrically connected to the wiring member 10 via a wiring 11. Therefore, the movable electrode 5, the fixed electrode 4a, and the fixed electrode 4b are electrically connected to the power supply 9 via the wiring 11 and the wiring member 10, respectively. Consequently, the voltage and current can be supplied to the sample SAM from the power supply 9.

Further, a control circuit capable of generating and controlling each voltage and each current is provided inside the power supply 9, and different voltages are applied to the movable electrode 5 (fixed electrode 4a) and the fixed electrode 4b, respectively. For example, when a positive voltage is applied to the movable electrode 5 (fixed electrode 4a), a negative voltage is applied to the fixed electrode 4b. Also, when a negative voltage is applied to the movable electrode 5 (fixed electrode 4a), a positive voltage is applied to the fixed electrode 4b.

The plurality of wiring members 10 may be located at any positions as long as they are connected to the wirings 11 on a lower surface or a side surface of the base 1, and the planar positions of the plurality of wiring members 10 are not limited to the positions shown in FIG. 1 and FIG. 2.

Examples of the materials of each structure constituting the sample holder HL will be described below.

The material constituting the base 1 in one example is a conductor having electrical conductivity and a non-magnetic material. The base 1 in one example is made of Al, C (graphite), stainless steel, Cu, Ta, Mo, Ti, W, brass, bronze, or a compound or alloy containing these materials.

The material constituting the partition wall 2 in one example is a conductor having electrical conductivity and a non-magnetic material. The partition wall 2 in one example is made of stainless steel, C (graphite), Al, Cu, Ta, Mo, Ti, W, brass, bronze, or a compound or alloy containing these materials.

Also, any material can be applied as the partition wall 2 as long as the space SP is not affected by the external environment of the sample holder HL and the partition wall 2 can be easily attached to and detached from the base 1. From this viewpoint, the partition wall 2 may be an insulating material such as ceramics or an insulating resin material such as a polyphenylene sulfide (PPS) resin, a polyether ether ketone (PEEK) resin, a polyamide (PA) resin, a polyimide (PI) resin, a fiber reinforced plastic (FRP) resin, or a glass epoxy resin.

The materials constituting the insulating members 3a and 3b in one example are an insulator and a non-magnetic material. The insulating members 3a and 3b in one example are made of an insulating material such as ceramics, zirconia, sapphire, or glass.

Also, any material can be applied as the insulating members 3a and 3b as long as the influence on the pressure change to the sample SAM applied due to its own deformation is small. From this viewpoint, the insulating members 3a and 3b may be an insulating resin material such as a polyphenylene sulfide (PPS) resin, a polyether ether ketone (PEEK) resin, a polyamide (PA) resin, a polyimide (PI) resin, a fiber reinforced plastic (FRP) resin, or a glass epoxy resin.

The materials constituting the fixed electrode 4b and the movable electrode 5 in one example are a conductor having electrical conductivity and a non-magnetic material. The fixed electrode 4b and the movable electrode 5 in one example are made of phosphor bronze, C (graphite), stainless steel, Al, Cu, Ta, Mo, Ti, W, brass, bronze, or a compound or alloy containing these materials.

Further, a plating film made of a non-magnetic material may be formed on each of the surfaces of the fixed electrode 4b and the movable electrode 5 for the purpose of reducing the contact resistance with the sample SAM. In one example, such a plating film is made of Au, Ag, Cu, Pt, Pd, Ir, Hf, or a compound or alloy containing these materials.

The materials constituting the fixed electrode 4a and the jig 7 in one example are a conductor having electrical conductivity and a non-magnetic material. The fixed electrode 4a and the jig 7 in one example are made of stainless steel, C (graphite), Al, Cu, Ta, Mo, Ti, W, brass, bronze, or a compound or alloy containing these materials.

The material constituting the wiring member 10 in one example is a conductor having electrical conductivity and a non-magnetic material. The wiring member 10 in one example is made of phosphor bronze, C (graphite), stainless steel, Al, Cu, Ta, Mo, Ti, W, brass, bronze, or a compound or alloy containing these materials.

Further, a plating film made of a non-magnetic material may be formed on the surface of the wiring member 10 for the purpose of reducing the contact resistance with the wiring 11.

In one example, such a plating film is made of Au, Ag, Cu, Pt, Pd, Ir, Hf, or a compound or alloy containing these materials.

<Charged Particle Beam Apparatus CRD in First Embodiment>

Figure 3:
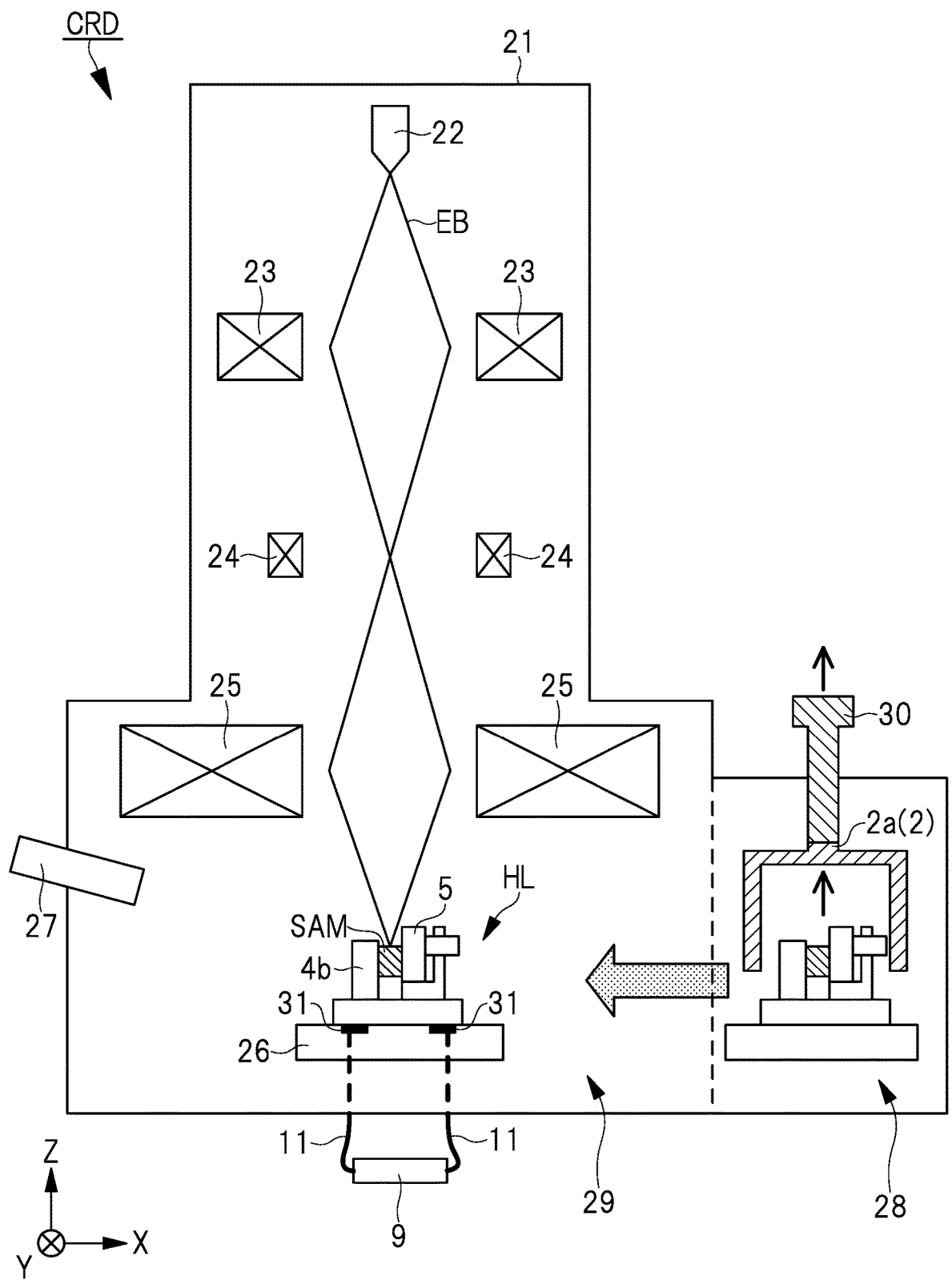
FIG. 3 is a schematic diagram showing a charged particle beam apparatus according to the first embodiment.

FIG. 3 is a schematic view showing the charged particle beam apparatus CRD provided with the above-mentioned sample holder HL. The charged particle beam apparatus CRD according to the first embodiment is, for example, a scanning electron microscope (SEM).

As shown in FIG. 3, the charged particle beam apparatus CRD includes an electron gun 22, a condenser lens (electronic lens) 23, a deflection coil (scanning coil) 24, an objective lens (electronic lens) 25, a stage 26, and a detector 27, and these are arranged in one mirror body 21. The mirror body 21 also includes a control circuit for controlling each configuration and others, but the illustrations thereof are omitted here. The condenser lens 23 and the objective lens 25 are electromagnets having coils, and the electromagnetic field generated from each of them functions as a lens that exerts a focusing action on an electron beam EB.

Further, the sample SAM to be observed here is, for example, an all-solid-state battery having a coin shape with a diameter of 5 mm or more and 20 mm or less and a thickness of 0.2 mm or more and 2 mm or less, more specifically, the one obtained by cutting this battery into a half-moon shape. With such a cut end face set as an observation surface (upper surface of the sample SAM), the sample SAM is held by the sample holder HL, and the observation by the charged particle beam apparatus CRD is performed in this state.

When observing the sample SAM to be observed, first, the sample holder HL on which the sample SAM is held is installed in a preparation chamber 28 connected to an observation chamber 29. In FIG. 3, the observation chamber 29 and the preparation chamber 28 are adjacent to each other. However, the observation chamber 29 and the preparation chamber 28 do not have to be adjacent to each other.

In other words, the observation chamber 29 and the preparation chamber 28 may be indirectly connected rather than directly connected. For example, the preparation chamber 28 is configured as a load lock mechanism, or the preparation chamber 28 has a load lock mechanism. In this example, by a mechanism such as an arm, a transfer rod, an actuator, and others (not shown), the sample holder HL can be moved between the preparation chamber 28 and the observation chamber 29 while maintaining the vacuum of the preparation chamber 28 and the observation chamber 29. The movement of the sample holder HL between the preparation chamber 28 and the observation chamber 29 may be performed automatically or manually. Next, if necessary, after the preparation chamber 28 is replaced with the same inert gas such as nitrogen gas or argon gas as the space SP, the partition wall 2 is detached by the protrusion 2a and a take-out device 30. The protrusion 2a has a hook shape, and the take-out device 30 has a pin shape. Therefore, the partition wall 2 is detached from the sample holder HL by inserting the take-out device 30 into the protrusion 2a and rotating the partition wall 2 to loosen the screw provided between the partition wall 2 and the base 1. After detaching the partition wall 2, the preparation chamber 28 is put into a vacuum state.

Next, the sample holder HL from which the partition wall 2 has been detached is mounted on the stage 26 of the observation chamber 29, and the observation of the sample SAM is started. The electron beam EB emitted from the electron gun 22 is reduced to a specific magnification by the condenser lens 23, scanned to a desired position in the sample SAM by the deflection coil 24, and focused as an electron spot on the sample SAM by the objective lens 25.

Further, the wiring member 10 of the sample holder HL is connected to a terminal 31 provided on the stage 26, and the terminal 31 is electrically connected to the power supply 9 provided outside the charged particle beam apparatus CRD via the wiring 11.

Therefore, at the time of observation, voltage and current are applied to the sample SAM by the sample holder HL, and a pressure is applied to the sample SAM by the sample holder HL. More specifically, a pressure is applied to the upper surface of the sample SAM. Namely, the electron beam EB is irradiated to the sample SAM while the sample SAM is in a charged state or a discharged state and the pressure is applied to the sample SAM.

The charged particle beam apparatus CRD is provided with the detector 27 such as a secondary electron detector, and the secondary electrons generated from the sample SAM when the electron beam EB collides with the sample SAM are detected by the detector 27. An observation image (SEM image, secondary electron image) can be obtained by displaying the amount of the detected secondary electrons as the brightness on an image processing device or the like electrically connected to the detector 27. The obtained observation image is recorded in a storage device (hard disk, flash memory, etc.) provided in the charged particle beam apparatus CRD.

As described above, it is possible to acquire how the structure of the sample SAM, which is in the charged state or the discharged state and in the pressure applied state, changes as a plurality of observation images.

In the charged particle beam apparatus CRD, in addition to the detector 27 described above, a backscattered electron detector for detecting backscattered electrons, an X-ray detector for performing element analysis of the sample SAM by detecting X-ray spectrum generated from the sample SAM, or the like may be provided. By using these detectors, it is also possible to observe how the structure of the sample SAM, which is in the charged state or the discharged state and in the pressure applied state, changes as a plurality of backscattered electron images or a plurality of X-ray spectra.

<Main Features in First Embodiment>

In the sample holder HL according to the first embodiment, the sample SAM can be held between the fixed electrode 4b and the movable electrode 5. Specifically, the sample SAM can be held between the side surface of the fixed electrode 4b facing the movable electrode 5 and the side surface of the movable electrode 5 facing the fixed electrode 4b. Further, since the movable electrode 5 is movable in the horizontal direction (X direction) by the pressure applying member 6, a desired pressure can be applied to the sample SAM.

Further, since the jig 7 is provided on the side surface of the movable electrode 5 facing the fixed electrode 4b, the position where the upper surface of the sample SAM is in contact with the lower surface of the jig 7 can be set as the measurement position. Consequently, when the sample SAM is mounted on the sample holder HL, the position of the sample SAM can be easily adjusted in the height direction (Z direction). Therefore, the observation work time of the charged particle beam apparatus CRD provided with the sample holder HL can be shortened.

Also, in the height direction, the upper surface of the sample SAM to be the observation surface is located within the range of the width of the rod-shaped pressure applying member 6. More precisely, the above-mentioned "width of the rod-shaped pressure applying member 6" is the width of the pressure applying member 6 in the height direction at the position where the pressure applying member 6 is in contact with the movable electrode 5. In other words, the upper surface of the sample SAM to be the observation surface is located between the uppermost surface and the lowermost surface of the pressure applying member 6. In still other words, in the height direction, the lower surface of the jig 7 is located within the range of the width of the pressure applying member 6 and is located between the uppermost surface and the lowermost surface of the pressure applying member 6. By adjusting the position of the pressure applying member 6 in this way, it is possible to efficiently apply a pressure to the upper surface of the sample SAM to be observed.

In particular, when the position of the axis line AL of the rod-shaped pressure applying member 6 is the same as the position of the upper surface of the sample SAM, the pressure can be applied to the upper surface of the sample SAM most efficiently. Further, the position of the axis line AL is, in other words, the center of the width of the pressure applying member 6 in the height direction. Namely, in the height direction, the upper surface of the sample SAM is located at the same height as the center of the width of the pressure applying member 6.

Here, at first glance, since the pressure is applied to the sample SAM even when the height position of the sample SAM and the height position of the pressure applying member 6 are almost the same (for example, when the height position of the center of the sample SAM is the same as the axis line AL of the pressure applying member 6), it seems that the same effect as that of the first embodiment can be obtained. However, in that case, the point of effort corresponding to the place where the pressure applying member 6 is in contact with the movable electrode 5 becomes substantially the center of the sample SAM. Then, the place where the strongest pressure is applied becomes the center of the sample SAM, and the structural change of the upper surface of the sample SAM to be observed is less likely to occur as compared with that at the center of the sample SAM.

Further, since the entire side surface of the sample SAM is in contact with the movable electrode 5 in the first embodiment, the pressure applied to the sample SAM seems to be uniform over the entire side surface of the sample SAM. However, as described above, the position of the point of effort is the place where the strongest pressure is applied.

Therefore, by applying the structure of the first embodiment, the point of effort is positioned so as to include the upper surface of the sample SAM. Also, there is no structure other than the jig 7 above the sample SAM. Therefore, a substantially uniform pressure is applied to the sample SAM as a whole, but the strongest pressure is applied to the upper surface of the sample SAM.

Although the change in pressure due to such a difference in the point of effort is minute, the sample SAM is a fine device, and the structure observed by the charged particle beam apparatus CRD is considered to be, for example, a fine structure in unit of nanometer (nm) or angstrom (Å). Therefore, even such a minute change in pressure has a great influence on the structural change of the sample SAM. Accordingly, in order to efficiently apply the pressure to the upper surface of the sample SAM which is the observation surface and obtain a more accurate observation image, the above-mentioned measures are important.

Further, the position of the upper surface of the sample SAM is preferably lower than the position of the upper surface of the fixed electrode 4b and the position of the upper surface of the movable electrode 5. In other words, the position of the lower surface of the jig 7 corresponding to the position of the upper surface of the sample SAM is preferably lower than the position of the upper surface of the fixed electrode 4b and the position of the upper surface of the movable electrode 5.

For example, the corner portion formed by the upper surface and the side surface of the fixed electrode 4b is a right angle in the drawing, but is actually chamfered or the like. Therefore, if the position of the upper surface of the sample SAM is the same as the position of the upper surface of the fixed electrode 4b, there is a possibility that sufficient pressure cannot be applied to the upper surface of the sample SAM because the corner portion of the fixed electrode 4b is chamfered. Accordingly, it is preferable that the above-mentioned relationship is satisfied such that the position of the upper surface of the sample SAM is slightly shifted downward.

Also, when observing the sample SAM in the charged particle beam apparatus CRD, different voltages are applied to the fixed electrode 4b and the movable electrode 5. Therefore, it is possible to confirm how the structure of the sample SAM, which is turned into a conductive state by the sample holder HL and to which a pressure is applied by the sample holder HL, changes as a plurality of observation images.

Further, for example, when the particles generated from the sample SAM are detected to obtain an observation image, the generated particles are detected by the detector 27 shown in FIG. 3. At this time, in order to facilitate the detection of the generated particles by the detector 27, it is preferable that the height of the fixed electrode 4b is low. For example, when the height of the fixed electrode 4b is high, the generated particles are obstructed by the fixed electrode 4b, and the amount of signals obtained by the detector 27 is reduced. Consequently, it becomes difficult to obtain a clearer observation image. Here, examples of the particles generated from the sample SAM include secondary electrons or X-rays. In particular, when X-rays are detected, the effect of shielding by the fixed electrode 4b is large, and the signal amount is significantly reduced.

Therefore, it is preferable that at least one of the height of the fixed electrode 4b and the height of the movable electrode 5 is lowered. In the example shown in FIG. 3, the sample holder HL is provided in the charged particle beam apparatus CRD such that the fixed electrode 4b is closer to the detector 27 than the movable electrode 5 is. Therefore, in the first embodiment, the position of the upper surface of the fixed electrode 4b is at least lower than the position of the upper surface of the movable electrode 5, and is lower than the position of the upper surface of the jig 7 and the position of the upper surface of the fixed electrode 4a.

In the first embodiment, the position of the upper surface of the movable electrode 5, the position of the upper surface of the fixed electrode 4a, and the position of the upper surface of the jig 7 are different from each other, but these may be the same positions.

In addition, it is also possible to provide the fixed electrode 4b as a movable electrode. For example, in the sample holder HL, an electrode having the same structure as the fixed electrode 4a, the movable electrode 5, and the pressure applying member 6 may be provided instead of the fixed electrode 4b.

First Modification

Figure 4:
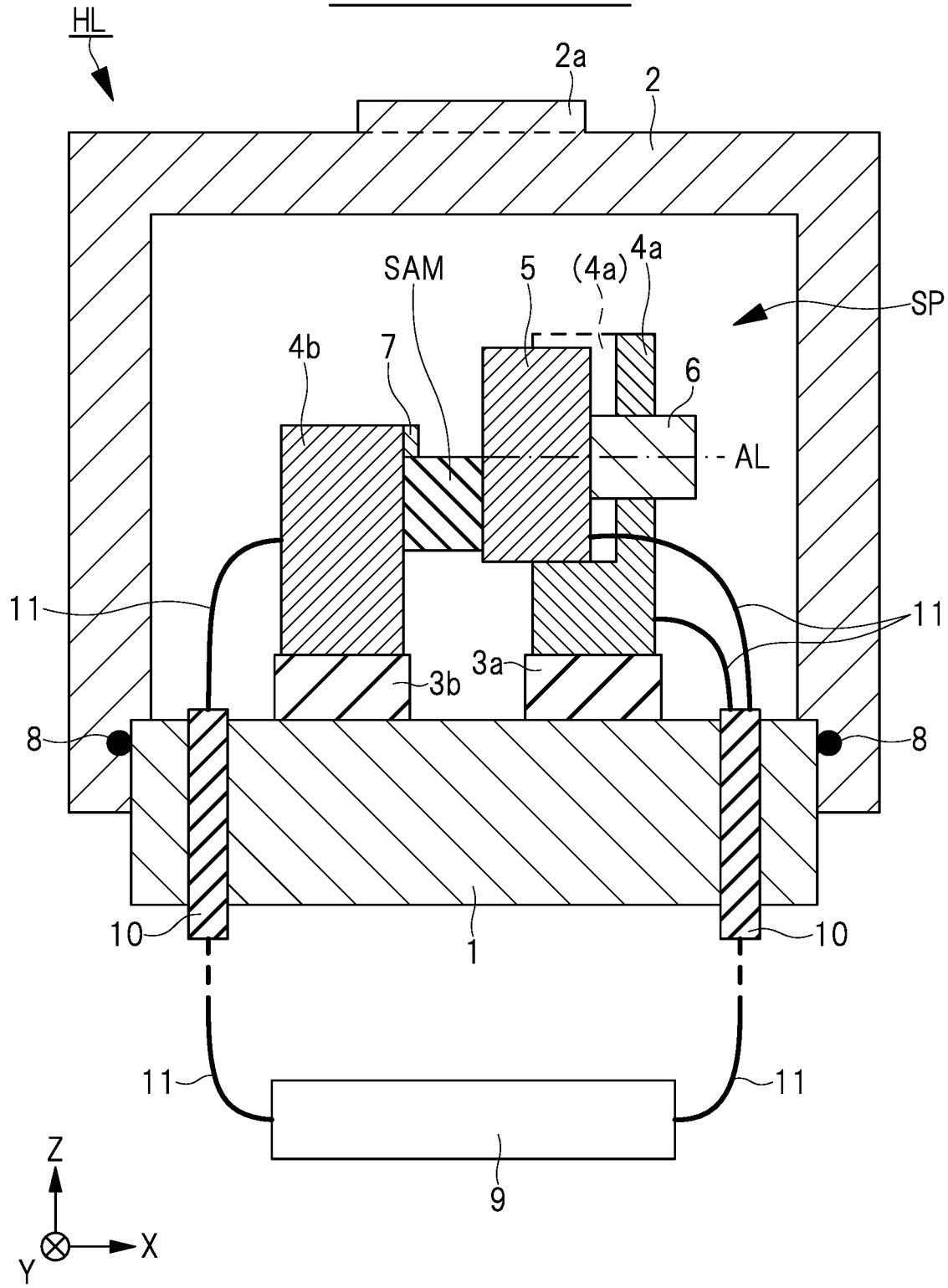
FIG. 4 is a cross-sectional view showing a sample holder according to the first modification.

FIG. 4 shows the sample holder HL according to the first modification of the first embodiment.

In the first embodiment described above, the jig 7 is provided on the side surface of the movable electrode 5 facing the fixed electrode 4b. In the first modification, as shown in FIG. 4, the jig 7 is provided on the side surface of the fixed electrode 4b facing the movable electrode 5.

Even in such a case, the position where the upper surface of the sample SAM is in contact with the lower surface of the jig 7 can be set as the measurement position. Therefore, when mounting the sample SAM on the sample holder HL, the height position of the sample SAM can be easily adjusted. Namely, the jig 7 may be provided on at least one of the movable electrode 5 and the fixed electrode 4b.

Although not shown, the jig 7 may be provided on both the side surface of the movable electrode 5 facing the fixed electrode 4b and the side surface of the fixed electrode 4b facing the movable electrode 5.

Second Embodiment

The sample holder HL according to the second embodiment will be described below with reference to FIG. 5. In the following, the difference from the first embodiment will be mainly described.

Figure 5:
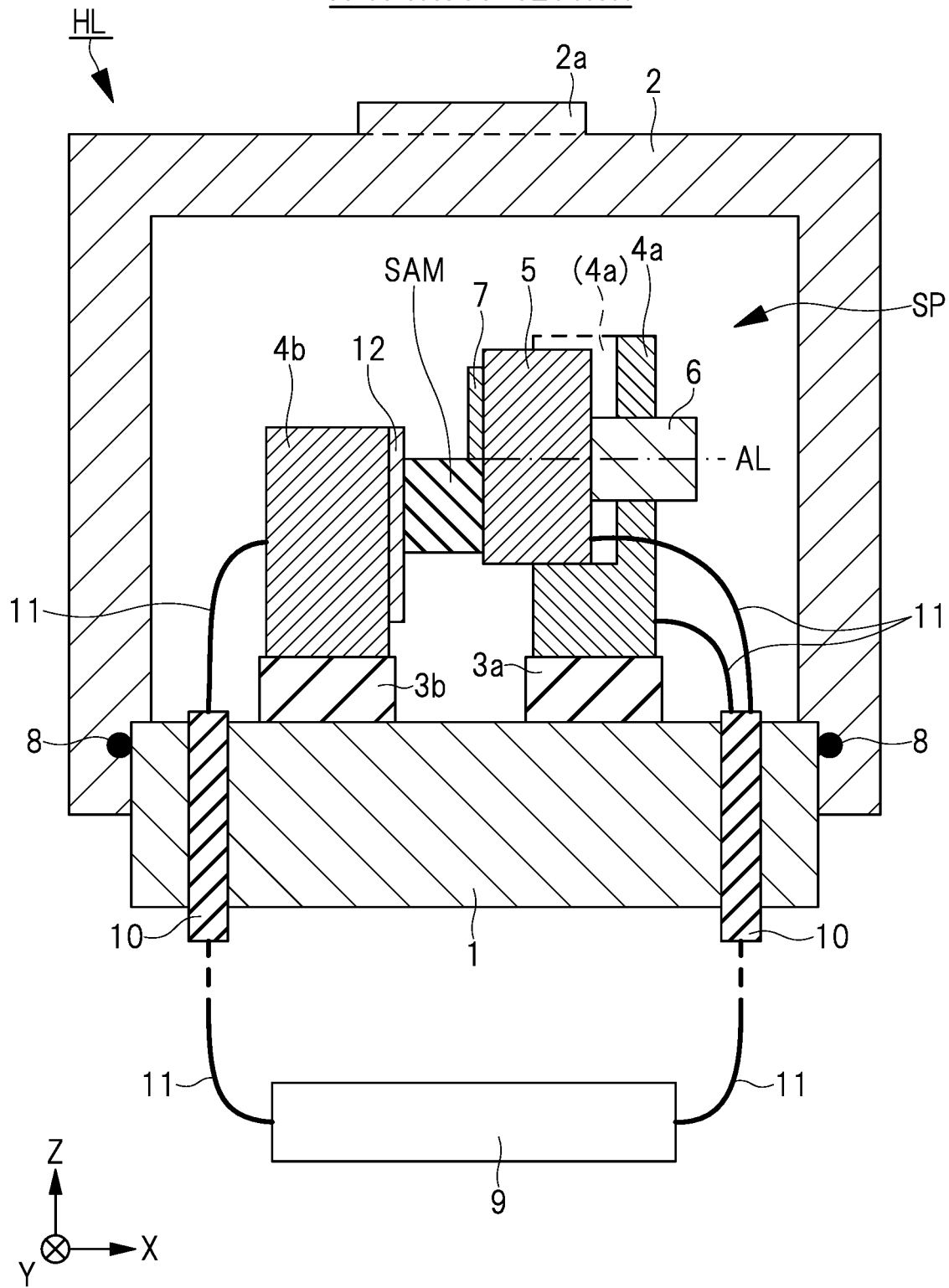
FIG. 5 is a cross-sectional view showing a sample holder according to the second embodiment.

As shown in FIG. 5, in the second embodiment, a cover member (resistance reduction member) 12 is provided on the side surface of the fixed electrode 4b facing the movable electrode 5. Namely, when observing the sample SAM, the cover member 12 is provided between the fixed electrode 4b and the sample SAM.

The material constituting the cover member 12 in one example is a conductor having electrical conductivity and a non-magnetic material. The cover member 12 in one example is made of phosphor bronze, C (graphite), stainless steel, Al, Cu, Ta, Mo, Ti, W, brass, bronze, or a compound or alloy containing these materials.

Further, a plating film made of a non-magnetic material may be formed on each surface of the cover member 12 for the purpose of reducing contact resistance. In one example, such a plating film is made of Au, Ag, Cu, Pt, Pd, Ir, Hf, or a compound or alloy containing these materials.

The cover member 12 is made of a material softer than the sample SAM. In other words, the hardness of the cover member 12 is lower than the hardness of the sample SAM. The "hardness" described here is a value indicated by Vickers hardness, Brinell hardness, Rockwell hardness, or the like, and can be measured by a measuring method appropriately used for each of them.

For example, when the sample SAM is an all-solid-state battery such as a lithium ion secondary battery, the all-solid-state battery is generally formed of a powder material as described in Patent Documents 3 and 4. Therefore, the surface of the all-solid-state battery is not strictly flat, and fine irregularities due to powders are formed. Accordingly, when the hardness of the fixed electrode 4b is high, the fixed electrode 4b is in point contact with the plurality of irregularities of the sample SAM. Consequently, the contact resistance between the fixed electrode 4b and the sample SAM tends to increase.

On the other hand, if the cover member 12 having a low hardness is used, the cover member 12 is easily deformed along the plurality of irregularities of the sample SAM when the pressure is applied to the sample SAM. Namely, the cover member 12 is likely to come into surface contact with the plurality of irregularities of the sample SAM. Therefore, it is possible to reduce the contact resistance between the cover member 12 and the sample SAM.

By the way, since the fixed electrode 4b functions also as a support column for holding the sample SAM, it is preferable that the hardness thereof is as high as possible. Therefore, by providing the cover member 12 having a low hardness on the fixed electrode 4b, it is possible to achieve both the role as a support column and the reduction of contact resistance. Namely, it is preferable that the material constituting the cover member 12 has a hardness lower than that of the material constituting the fixed electrode 4b.

For example, when the case in which the cover member 12 is made of stainless steel and the case in which the cover member 12 is made of phosphor bronze are compared, since the hardness of phosphor bronze is lower than that of stainless steel, the contact resistance can be reduced in the case in which the cover member 12 is made of phosphor bronze.

Second Modification

Figure 6:
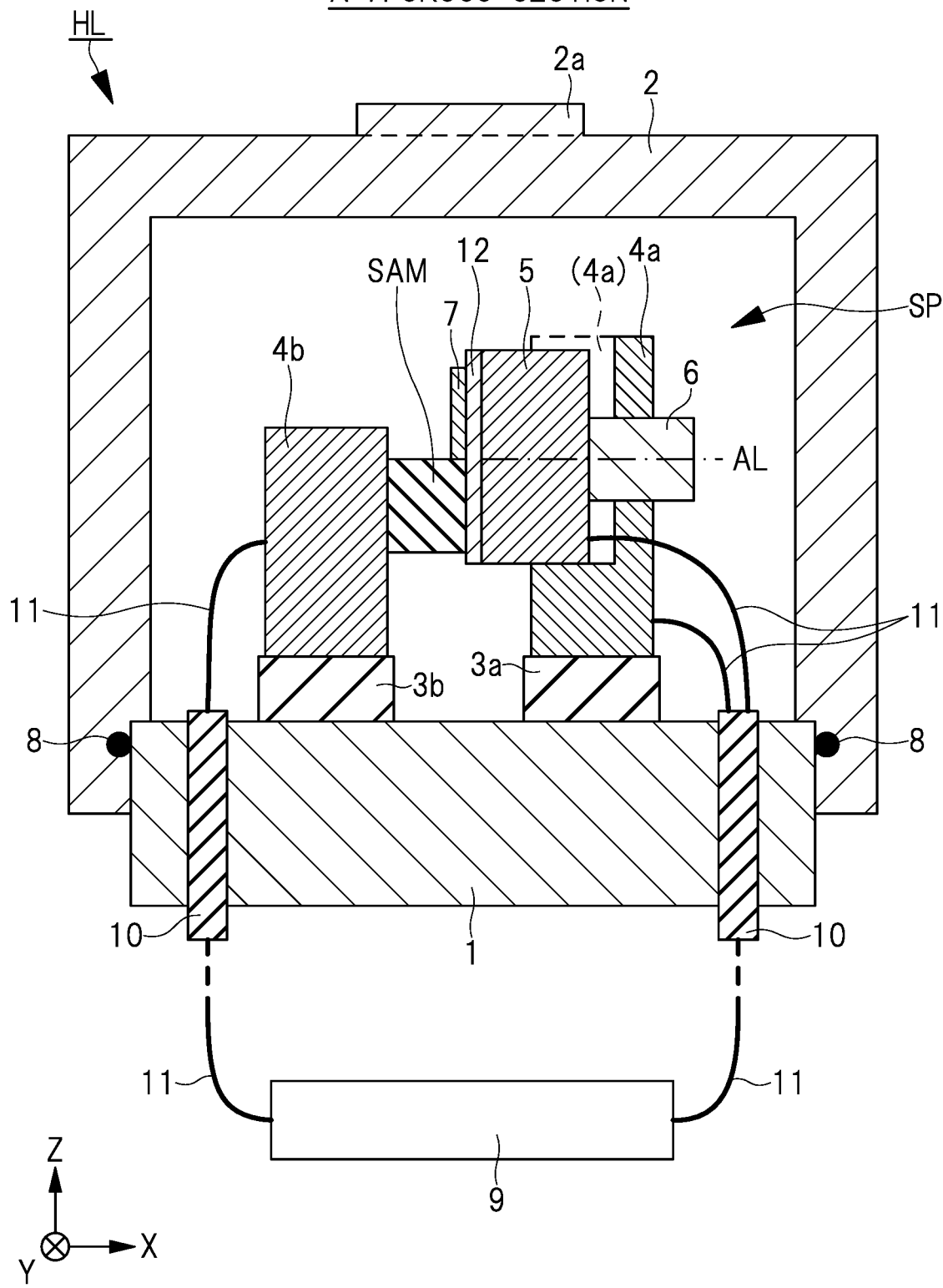
FIG. 6 is a cross-sectional view showing a sample holder according to the second modification.

FIG. 6 shows the sample holder HL according to the second modification of the second embodiment.

In the second embodiment described above, the cover member 12 is provided on the side surface of the fixed electrode 4b facing the movable electrode 5. In the second modification, as shown in FIG. 6, the cover member 12 is provided on the side surface of the movable electrode 5 facing the fixed electrode 4b. Further, the hardness of the cover member 12 is lower than that of the sample SAM and lower than that of the movable electrode 5.

Even in such a case, the contact resistance between the cover member 12 and the sample SAM can be reduced as compared with the contact resistance between the movable electrode 5 and the sample SAM. Namely, the cover member 12 may be provided on at least one of the movable electrode 5 and the fixed electrode 4b.

Although not shown, the cover member 12 may be provided on both the side surface of the movable electrode 5 facing the fixed electrode 4b and the side surface of the fixed electrode 4b facing the movable electrode 5. In that case, the contact resistance to the sample SAM can be further reduced.

Third Embodiment

The sample retainer HL according to the third embodiment will be described below with reference to FIG. 7. In the following, the difference from the first embodiment or the second embodiment will be mainly described.

Figure 7:
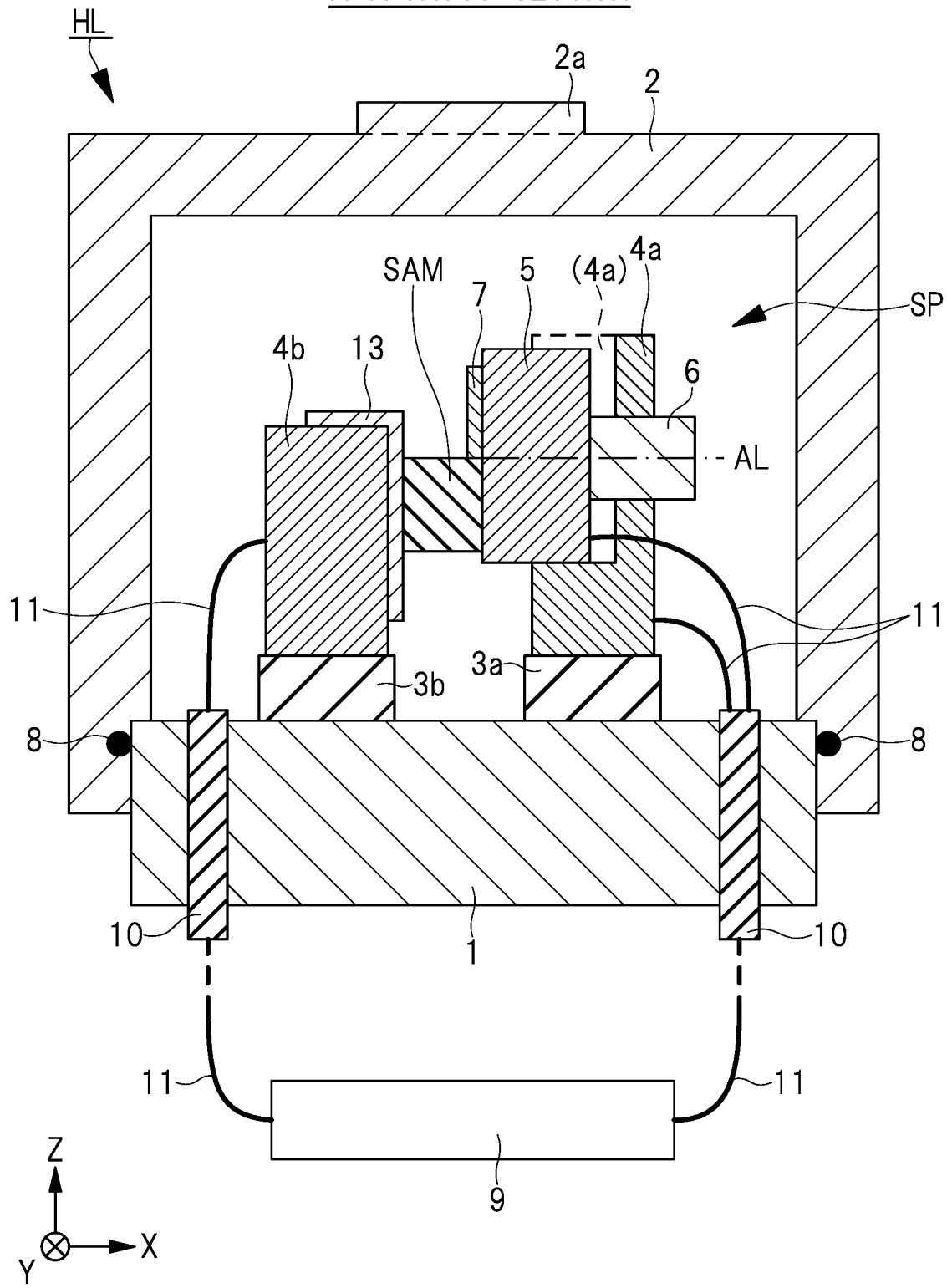
FIG. 7 is a cross-sectional view showing a sample holder according to the third embodiment.

As shown in FIG. 7, in the third embodiment, a cover member (protective member) 13 is provided on the side surface of the fixed electrode 4b facing the movable electrode 5 and on the upper surface thereof. Namely, when observing the sample SAM, the cover member 13 is provided between the fixed electrode 4b and the sample SAM. Although not shown in detail, the cover member 13 according to the third embodiment may be easily attached to and detached from the fixed electrode 4b by a simple fixing means such as a spring force or screwing.

When the sample SAM is an all-solid-state battery such as a lithium ion secondary battery as mentioned above, the all-solid-state battery is generally formed of a powder material and is fragile in some cases. When the sample SAM is fragile, the sample SAM may partially collapse due to the pressure applied by the pressure applying member 6. This collapsed sample SAM may adhere to the fixed electrode 4b as a deposit. As a result, the contact area between the sample SAM and the fixed electrode 4b is reduced, and the contact resistance may increase. Further, there is a possibility that a chemical reaction may occur due to the contact between different materials and a foreign matter caused by the above-mentioned deposits is generated.

Therefore, for example, when observing one sample and then observing another sample, it is necessary to remove the deposits and the like, but there are cases where the deposits or foreign matters cannot be easily removed by a normal cleaning process or the like. In such a case, it is necessary to replace the sample holder HL itself, resulting in the increase of the cost for observation using the charged particle beam apparatus CRD.

The cover member 13 according to the third embodiment is provided so as to cover the side surface and the upper surface of the fixed electrode 4b. Therefore, even if the deposit is generated, the deposit adheres to the cover member 13, so that the fixed electrode 4b is protected. Since the cover member 13 can be easily attached to and detached from the fixed electrode 4b, if only the cover member 13 is replaced, it is not necessary to replace the sample holder HL itself, and observation using the charged particle beam apparatus CRD can be performed immediately. Therefore, it is possible to suppress the increase in the cost and time required for observation.

Further, the material constituting the cover member 13 according to the third embodiment may be selected from the same materials as the material constituting the cover member 12 according to the second embodiment, including the plating film formed on the surface thereof. However, in the third embodiment, from the viewpoint of deposits, unlike the second embodiment, the material constituting the cover member 13 and the material constituting the fixed electrode 4b may be the same material or may be different materials.

Namely, the hardness of the cover member 13 and the hardness of the fixed electrode 4b may be the same or different from each other.

However, it is also possible to give the same function as the cover member 12 according to the second embodiment to the cover member 13 according to the third embodiment. Namely, if the viewpoint of reducing the contact resistance is also taken into consideration in addition to the viewpoint of deposits, it is preferable that the material constituting the cover member 13 has a hardness lower than that of the sample SAM and that of the material constituting the fixed electrode 4b for the same reason as in the second embodiment.

Third Modification

FIG. 8 shows the sample holder HL according to the third modification of the third embodiment.

In the third embodiment described above, the cover member 13 is provided on the side surface of the fixed electrode 4b facing the movable electrode 5 and on the upper surface thereof. In the third modification, as shown in FIG. 8, the cover member 13 is provided on the side surface of the movable electrode 5 facing the fixed electrode 4b and on the upper surface thereof. Further, as in the third embodiment, the cover member 13 according to the third modification can also be easily attached to and detached from the movable electrode 5 by a simple fixing means such as a spring force or screwing.

Even in such a case, since the deposit generated from the sample SAM adheres to the cover member 13, the movable electrode 5 is protected. Therefore, if only the cover member 13 is replaced, it is not necessary to replace the sample holder HL itself.

Further, the material constituting the cover member 13 and the material constituting the movable electrode 5 may be the same material or may be different materials. Namely, the hardness of the cover member 13 and the hardness of the movable electrode 5 may be the same or different from each other.

However, if the viewpoint of reducing the contact resistance is taken into consideration in addition to the viewpoint of deposits as in the third embodiment, it is preferable that the material constituting the cover member 13 has a hardness lower than that of the sample SAM and that of the material constituting the movable electrode 5.

Although not shown, the cover member 13 may be provided on the side surface of the movable electrode 5 facing the fixed electrode 4b and the upper surface thereof and on the side surface of the fixed electrode 4b facing the movable electrode 5 and the upper surface thereof, respectively. Consequently, both the movable electrode 5 and the fixed electrode 4b can be protected from deposits, and the contact resistance with the sample SAM can be further reduced.

The present invention has been specifically described above based on the embodiments, but the present invention is not limited to the above-described embodiments and can be variously modified within the range not departing from the gist thereof.

For example, in the above embodiments, the sample SAM is an electronic material and an all-solid-state battery is used as an example of the electronic material. However, the sample SAM is not limited to an all-solid-state battery, and any electronic material can be applied as long as it is the electronic material for which observation of electrical characteristics performed while applying pressure is required.

REFERENCE SIGNS LIST 1 base
2 partition wall
3a, 3b insulating member
4a, 4b fixed electrode
5 movable electrode
6 pressure applying member
7 jig (alignment member)
8 O-ring
9 power supply
10 wiring member
11 wiring
12 cover member (resistance reduction member)
13 13 cover member (protective member)
21 mirror body
22 electron gun
23 condenser lens
24 deflection coil
25 objective lens
26 stage
27 detector
28 preparation chamber
29 observation chamber
30 take-out device
31 terminal
AL axis line
CRD charged particle beam apparatus
EB electron beam
HL sample holder
SAM sample
SP space

The invention claimed is:

1. A sample holder used for a charged particle beam apparatus, the sample holder comprising:
   a first electrode having a first side surface;
   a second electrode having a second side surface facing the first side surface; and
   a pressure applying member attached to the first electrode and having a function to move the first electrode in a horizontal direction,
   wherein when a sample is held between the first side surface and the second side surface, an upper surface of the sample can be located within a range of a first width of the pressure applying member at a position where the pressure applying member is in contact with the first electrode, in a height direction orthogonal to the horizontal direction.

2. The sample holder according to claim 1, wherein the upper surface of the sample is located at the same height as a center of the first width.

3. The sample holder according to claim 1, wherein when observing the sample, different voltages are supplied to the first electrode and the second electrode, respectively, thereby turning the sample into a conductive state.

4. The sample holder according to claim 1, wherein a jig is provided on the first side surface or the second side surface, and
   wherein the sample is provided between the first side surface and the second side surface such that the upper surface of the sample is in contact with a lower surface of the jig.

5. The sample holder according to claim 4,
wherein a position of the lower surface of the jig is lower than a position of an upper surface of the first electrode and a position of an upper surface of the second electrode.

6. The sample holder according to claim 1,
wherein a first cover member is provided on the first side surface or the second side surface,
wherein when the first cover member is provided on the first side surface, a material constituting the first cover member has a hardness lower than that of a material constituting the first electrode, and
wherein when the first cover member is provided on the second side surface, the material constituting the first cover member has a hardness lower than that of a material constituting the second electrode.

7. The sample holder according to claim 1,
wherein a second cover member which can be attached to and detached from the first electrode or the second electrode is provided on the first side surface and an upper surface of the first electrode or on the second side surface and an upper surface of the second electrode.

8. The sample holder according to claim 7,
wherein when the second cover member is provided on the first side surface and the upper surface of the first electrode, a material constituting the second cover member has a hardness lower than that of a material constituting the first electrode, and
wherein when the second cover member is provided on the second side surface and the upper surface of the second electrode, the material constituting the second cover member has a hardness lower than that of a material constituting the second electrode.

9. A charged particle beam apparatus comprising:
the sample holder according to claim 1;
a stage on which the sample holder can be mounted; and
a detector configured to detect particles generated from a sample held on the sample holder.

10. The charged particle beam apparatus according to claim 9 further comprising:
an observation chamber provided with the stage and the detector; and
a preparation chamber adjacent to the observation chamber and capable of installing the sample holder,
wherein the sample holder can be moved between the observation chamber and the preparation chamber while maintaining vacuum of the observation chamber and the preparation chamber.

11. The charged particle beam apparatus according to claim 9 further comprising:
an electron gun;
an electronic lens configured to focus an electron beam emitted from the electron gun; and
a deflection coil configured to scan the electron beam to a desired position of the sample when the sample holder is mounted on the stage,
wherein the second electrode is provided closer to the detector than the first electrode is, and
wherein a position of an upper surface of the second electrode is lower than a position of an upper surface of the first electrode.

12. A sample holder used for a charged particle beam apparatus, the sample holder comprising:
a first electrode having a first side surface;
a second electrode having a second side surface facing the first side surface; and
a pressure applying member attached to the first electrode and having a function to move the first electrode in a horizontal direction,
wherein a jig is provided on the first side surface or the second side surface, and
wherein a lower surface of the jig is located within a range of a first width of the pressure applying member at a position where the pressure applying member is in contact with the first electrode, in a height direction orthogonal to the horizontal direction.

13. The sample holder according to claim 12,
wherein the lower surface of the jig is located at the same height as a center of the first width.

14. The sample holder according to claim 12,
wherein a first cover member is provided on the first side surface or the second side surface,
wherein when the first cover member is provided on the first side surface, a material constituting the first cover member has a hardness lower than that of a material constituting the first electrode, and
wherein when the first cover member is provided on the second side surface, the material constituting the first cover member has a hardness lower than that of a material constituting the second electrode.

15. The sample holder according to claim 12,
wherein a second cover member which can be attached to and detached from the first electrode or the second electrode is provided on the first side surface and an upper surface of the first electrode or on the second side surface and an upper surface of the second electrode.

* * * * *